(12) United States Patent
Chang et al.

(10) Patent No.: US 7,470,924 B2
(45) Date of Patent: Dec. 30, 2008

(54) PHASE CHANGE RAM DEVICE WITH INCREASED CONTACT AREA BETWEEN WORD LINE AND ACTIVE AREA

(75) Inventors: Heon Yong Chang, Kyoungki-do (KR); Byoung Ok Song, Chungcheongbuk-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 89 days.

(21) Appl. No.: 11/438,872

(22) Filed: May 23, 2006

(65) Prior Publication Data
US 2006/0270102 A1    Nov. 30, 2006

(30) Foreign Application Priority Data
May 26, 2005    (KR)    .................... 10-2005-0044598

(51) Int. Cl.
*H01L 29/06* (2006.01)
*H01L 47/00* (2006.01)
(52) U.S. Cl. ......................................................... 257/5
(58) Field of Classification Search ............ 257/3, 257/4, 5, 296
See application file for complete search history.

(56) References Cited
U.S. PATENT DOCUMENTS

| | | | |
|---|---|---|---|
| 6,143,604 A * | 11/2000 | Chiang et al. ............ 438/253 |
| 6,236,059 B1 * | 5/2001 | Wolstenholme et al. ........ 257/3 |
| 6,534,781 B2 * | 3/2003 | Dennison ........................ 257/5 |
| 6,791,859 B2 * | 9/2004 | Hush et al. ................... 365/100 |
| 7,037,749 B2 * | 5/2006 | Horii et al. ..................... 438/95 |
| 7,049,623 B2 * | 5/2006 | Lowrey ........................... 257/3 |
| 7,067,837 B2 * | 6/2006 | Hwang et al. ................... 257/3 |
| 7,071,485 B2 * | 7/2006 | Takaura et al. ................. 257/3 |
| 7,295,463 B2 * | 11/2007 | Yang et al. ..................... 365/163 |
| 2003/0209746 A1 * | 11/2003 | Horii .......................... 257/295 |
| 2003/0222292 A1 * | 12/2003 | Joo et al. ..................... 257/296 |
| 2004/0042298 A1 * | 3/2004 | Hideki ....................... 365/202 |
| 2004/0166604 A1 * | 8/2004 | Ha et al. ..................... 438/102 |
| 2004/0233748 A1 * | 11/2004 | Terao et al. ................. 365/202 |
| 2005/0130414 A1 * | 6/2005 | Choi et al. .................. 438/672 |
| 2005/0270832 A1 * | 12/2005 | Chu et al. ................... 365/163 |

* cited by examiner

*Primary Examiner*—Jerome Jackson, Jr.
*Assistant Examiner*—Anthony Ho
(74) *Attorney, Agent, or Firm*—Ladas & Parry LLP

(57) ABSTRACT

A phase change RAM device, has a first metal wiring for a bit line that is separated from a second metal wiring for applying a supply voltage. A method for fabricating the phase change RAM device includes the steps of forming an isolation layer formed so as to define a T-shaped active area in the semiconductor substrate, forming a word line formed on the active area of the semiconductor substrate including the isolation layer, forming source/drain areas formed at both sides of the word line in the active area, forming an insulating interlayer on entire surface of the semiconductor substrate so as to cover the word line, and forming a first tungsten plug in a portion of the insulating interlayer on the source area and a second tungsten plug in a portion of the insulating interlayer on the drain area.

8 Claims, 5 Drawing Sheets

PHASE CHANGE RAM DEVICE WITH INCREASED CONTACT AREA BETWEEN WORD LINE AND ACTIVE AREA

FIELD OF THE INVENTION

The present invention relates to a phase change RAM device and a method for fabricating the same. More particularly, the invention relates to a phase change RAM device in which a first metal wiring for a bit line is separated from a second metal wiring for applying a supply voltage, and a method for fabricating the same.

BACKGROUND

As generally known in the art, semiconductor memory devices can be classified into volatile random access memory (RAM), which loses information stored therein if power is cut off, and non-volatile read only memory (ROM), which continuously retains information stored therein even if power is cut off. The volatile RAM can be further classified into dynamic RAM (DRAM), which needs to be refreshed in order to retain stored information and static RAM (SRAM), which will retain stored information as long as power to the SRAM is maintained. Non-volatile ROM includes a flash memory such as an electrically erasable and programmable ROM.

Those skilled in the art, know that even though the DRAM is a widely used memory device, DRAMs store information using capacitance and they preferably have a high storage capacitance in order to reduce the rate at which a DRAM must be refreshed. As is known in the art, a capacitor's capacitance is a function of the capacitor's electrodes surface areas, electrode separation distance or spacing and the dielectric constant of material between electrodes. Thus, it is generally necessary for a DRAM to have a relatively large surface area of electrodes. Electrode surface area creates a problem in that it limits DRAM integration.

Flash memory requires operational voltage higher than supply voltage because the flash memory has a stacked structure of two gates. Accordingly, the flash memory must additionally have a booster circuit in order to obtain voltage required for writing and deleting operations, so it is difficult to highly integrate the flash memory.

Many researches have been performed in order to develop new highly integrated memory devices having a simple structure with characteristics of the non-volatile memory devices. As one example of the new highly integrated memory devices, a phase change RAM device has recently been suggested.

The phase change RAM device determines information stored in a cell according to a resistance difference between a crystalline state and an amorphous state of a phase change layer. A phase change memory device is based on the fact that the phase change layer interposed between bottom and top electrodes undergoes phase change from the crystalline state to the amorphous state as electric current flows between the bottom and top electrodes.

In other words, the phase change RAM device employs a chalcogenide layer as the phase change layer, and such a chalcogenide layer is a compound layer including Ge, Sb, and Te. The chalcogenide layer undergoes phase change between an amorphous state and a crystalline state as current, that is, joule heat is applied thereto. In this case, since the resistivity of the phase change layer having the amorphous state is higher than the resistivity of the phase change layer having the crystalline state, it is determined whether the information stored in a phase change memory cell is logic "1" or logic "0" by detecting current flowing through the phase change layer in a reading mode.

FIG. 1 is a sectional view illustrating a prior art conventional phase change RAM device.

As shown in FIG. 1, gates 4 are formed on an active area of a semiconductor substrate 1, which is defined by an isolation layer, and a junction area (not shown) is formed on the semiconductor substrate at both sides of the gates 4. An insulating interlayer 5 is formed on an entire surface of the semiconductor substrate 1 in such a manner that the insulating interlayer 5 covers the gates 4. A first tungsten plug 6a and a second tungsten plug 6b are formed at predetermined portions of the insulating interlayer 5 where the PCM (Phase Change Material) cell is formed and a ground voltage (Vss) is applied, respectively.

A first oxide layer 7 is formed on the insulating interlayer 5 having the first tungsten plug 6a and the second tungsten plug 6b. According to a damascene process, a dotted metal pad 8 is formed at an area to be provided with the PCM cell such that the dotted metal pad 8 can make contact with the first tungsten plug 6a, and a bar-type ground line 9 (a Vss line) is formed at an area, to which the ground voltage is applied, such that the bar-type ground line 9 (the Vss line) can make contact with the second tungsten plug 6b.

Sequentially, a second oxide layer 10 is formed on the first oxide layer 7 having the metal pad 8 and the bar-type ground line 9 (the Vss line), and a plug-type bottom electrode contact 11 is formed in a predetermined portion of the second oxide layer 10 to be provided with the PCM cell such that the plug-type bottom electrode contact 11 can make contact with the metal pad 8.

A PCM layer 12 and a top electrode 13 are stacked on the second oxide layer 10 to be provided with a PCM cell in the form of a pattern such that the PCM layer 12 and the top electrode 13 can make contact with the bottom electrode contact 11. Accordingly, the PCM cell including a plug-type bottom electrode, that is, the bottom electrode contact 11, the PCM layer 12 stacked on the plug-type bottom electrode contact 11, and the top electrode 13 stacked on the PCM layer 12 is formed.

In addition, a third oxide layer 14 is formed on the second oxide layer 10 such that the third oxide layer 14 can cover the PCM cell, and a metal wiring 15 is formed on the third oxide layer 14 such that the metal wiring 15 can make contact with the top electrode 13.

Meanwhile, although it is not shown, a metal wiring for applying the supply voltage is formed together with the metal wiring 15 such that the metal wiring 15 can make contact with a drain of a cell transistor to which the supply voltage Vdd is applied.

However, according to the conventional phase change RAM device described above, a metal wiring for a bit line must be formed on the top electrode of the PCM cell, and a metal wiring for a supply voltage must be formed on the upper part of a drain of the cell transistor to which the supply voltage Vdd is applied, so that the layout of the phase change RAM device becomes complex.

SUMMARY OF THE INVENTION

An object of the present invention is to provide a phase change RAM device in which a first metal wiring for a bit line is separated from a second metal wiring for applying a supply voltage, and a method for fabricating the same.

To accomplish the above object, there is provided a phase change RAM device including a semiconductor substrate, an isolation layer formed in the semiconductor substrate so as to define a substantially T-shaped active area in the semiconductor substrate, a word line formed on the active area of the semiconductor substrate including the isolation layer, source/drain areas formed at both sides of the word line in the active area, a first metal pad formed in the source area, and a second metal pad formed in the drain area, to which a supply voltage is applied, a GST cell consisting of Ge, Sb, and Te and being formed on the source area, the GST cell having a stacked structure of a phase change layer, a top electrode, and a bottom electrode formed on the first metal pad, a first metal wiring for a bit line used for signal sensing, which is arranged in a direction vertical to the word line and makes contact with the top electrode of the GST cell, and a second metal wiring for applying a supply voltage, which is arranged in a direction vertical to the word line and makes contact with the second metal pad of the drain area.

The phase change RAM device according to the present invention further includes an insulating interlayer interposed between the source/drain areas including the word line and first and second metal pads, and a first tungsten plug formed so as to connect the source area with the first metal pad in the insulating interlayer, and a second tungsten plug formed so as to connect the drain area with the second metal pad in the insulating interlayer.

In addition, the phase change RAM device according to the present invention further includes a first oxide layer formed on the insulating interlayer such that the first oxide layer covers the first and second metal pads.

Furthermore, the phase change RAM device according to the present invention further includes a second oxide layer for covering the GST cell formed on the first oxide layer.

Predetermined portions of the word line, which pass through the active area, are curved in such a manner that a contact area between the active area and the word line is enlarged.

The second metal pad has a size larger than a size of the first metal pad.

The bottom electrode is formed within the first oxide layer in a plug shape.

According to another aspect of the present invention, there is provided a method for manufacturing a phase change RAM device, the method including the steps of forming an isolation layer formed so as to define a T-shaped active area in the semiconductor substrate, forming a word line formed on the active area of the semiconductor substrate including the isolation layer, forming source/drain areas formed at both sides of the word line in the active area, forming an insulating interlayer on entire surface of the semiconductor substrate so as to cover the word line, forming a first tungsten plug in a portion of the insulating interlayer on the source area and a second tungsten plug in a portion of the insulating interlayer on the drain area, forming a dotted first metal pad on the first tungsten plug and a dotted second metal pad on the second tungsten plug, forming a first oxide layer on the insulating interlayer so as to cover the first and second metal pads, forming a plug-shaped bottom electrode making contact with the first metal pad in the first oxide layer, forming a GST cell including Ge, Sb, and Te by stacking a top electrode and a phase change layer on the first oxide layer including the bottom electrode, forming a second oxide layer on the first oxide layer so as to cover the GST cell, and forming a first metal wiring for a bit line and a second metal wiring for applying a supply voltage on the second oxide layer, in which the first metal wiring makes electrical contact with the top electrode of the GST cell making contact with the source area, and the second metal wiring makes electrical contact with the second metal pad making contact with the drain area.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Figure 1:
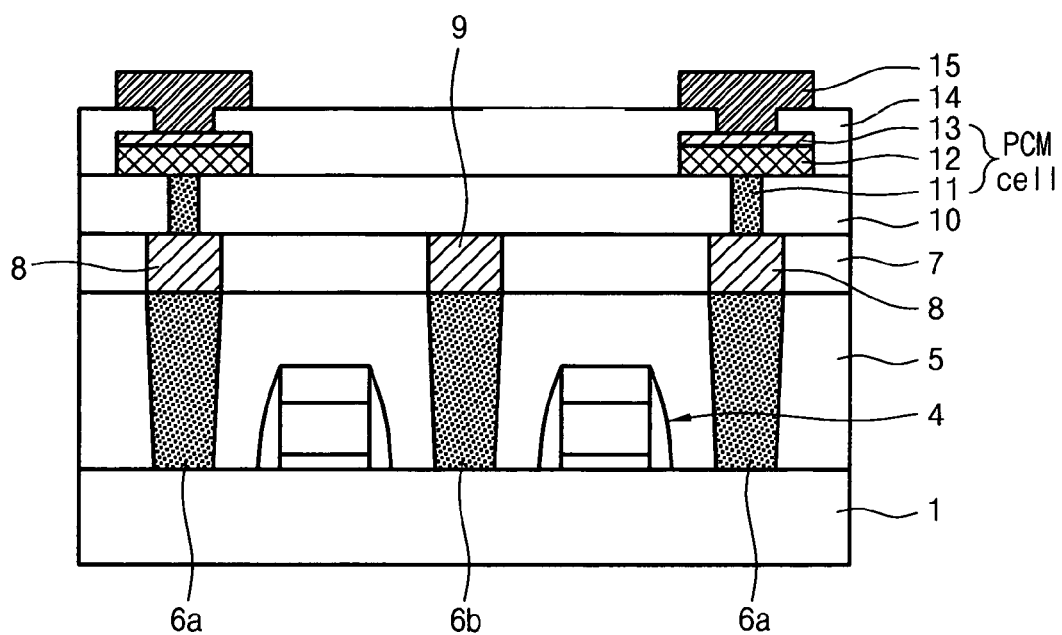
FIG. 1 is a sectional view illustrating a conventional, prior art phase change RAM device.

Hereinafter, a preferred embodiment of the present invention will be described with reference to the accompanying drawings. In the following description and drawings, the same reference numerals are used to designate the same or similar components, and so repetition of the description on the same or similar components will be omitted.

According to the present invention, the layout of a phase change RAM device is changed such that a first metal wiring that is used for a signal sensing bit line can be formed at an upper part of a source area having a PCM cell and a second metal wiring for applying a supply voltage can be formed at an upper part of a drain to which a supply voltage Vdd of a cell transistor is applied. Thus, the first metal wiring for a bit line and the second wiring for a supply voltage are formed to be separated from each other, so that the first and second metal wirings can be stably formed.

In addition, the second metal wiring for applying the supplying voltage has a width larger than that of the first metal wiring for a bit line used for signal sensing. By increasing the size of the second metal wirigin, voltage drop is reduced or eliminated, thus writing current necessary for changing the phase of a PCM layer may be made uniform.

In detail, FIGS. 2a to 2d are top views of a phase change RAM as it progresses through the manufacturing procedure for a phase change RAM device according to the present invention.

Figure 2A:
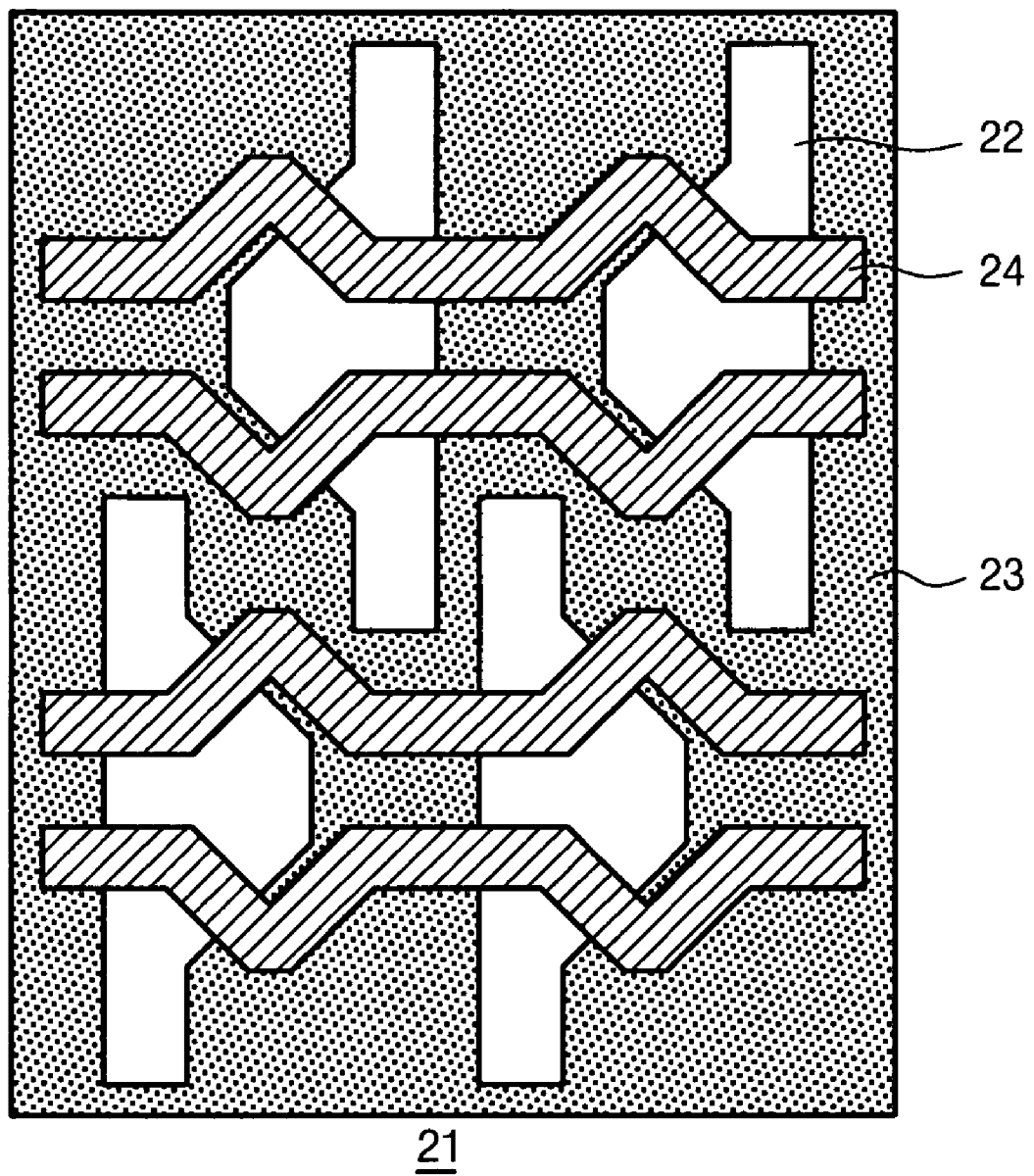
FIGS. 2a to 2d are top views illustrating the manufacturing procedure for a phase change RAM device according to the present invention.

Referring to FIG. 2a, an isolation layer 23 defining an active area 22 is formed on a semiconductor substrate 21. As shown in FIG. 2a, the active area 22 has a modified trapezoidal shape reminiscent of the shape of the letter 'T' (i.e., substantially T shape), instead of the straight shape found in the prior art. Thus, the active area 22 is referred to herein as being T-shaped or substantially T-shaped.

A word line 24 is formed over the entire surface of the semiconductor substrate 21 according to a typical process. As shown in the figure, predetermined portions of the word line 24, which pass through the active area, are curved or angular.

Although they are not shown, source/drain areas are formed in the active area 22 of the semiconductor substrate 21 at both sides of the word line 24 through an ion-implantation process using high-density impurity, thereby forming a cell transistor.

By changing the active area 22 from a straight shape to a substantially T-shape, and by changing the word line 24 from a straight shape to a curved-shape, contact area between the active area 22 and the word line 24 is increased or enlarged. Thus, a channel width of the cell transistor is also enlarged as compared with that of the conventional technique. Accordingly, it is possible to increase an amount of current between the source area and the drain area, so that the phase of a PCM layer can be rapidly changed from a crystalline state to an amorphous state, or vice versa. Therefore, it is possible to improve an operation speed of the phase change RAM device.

Figure 2B:
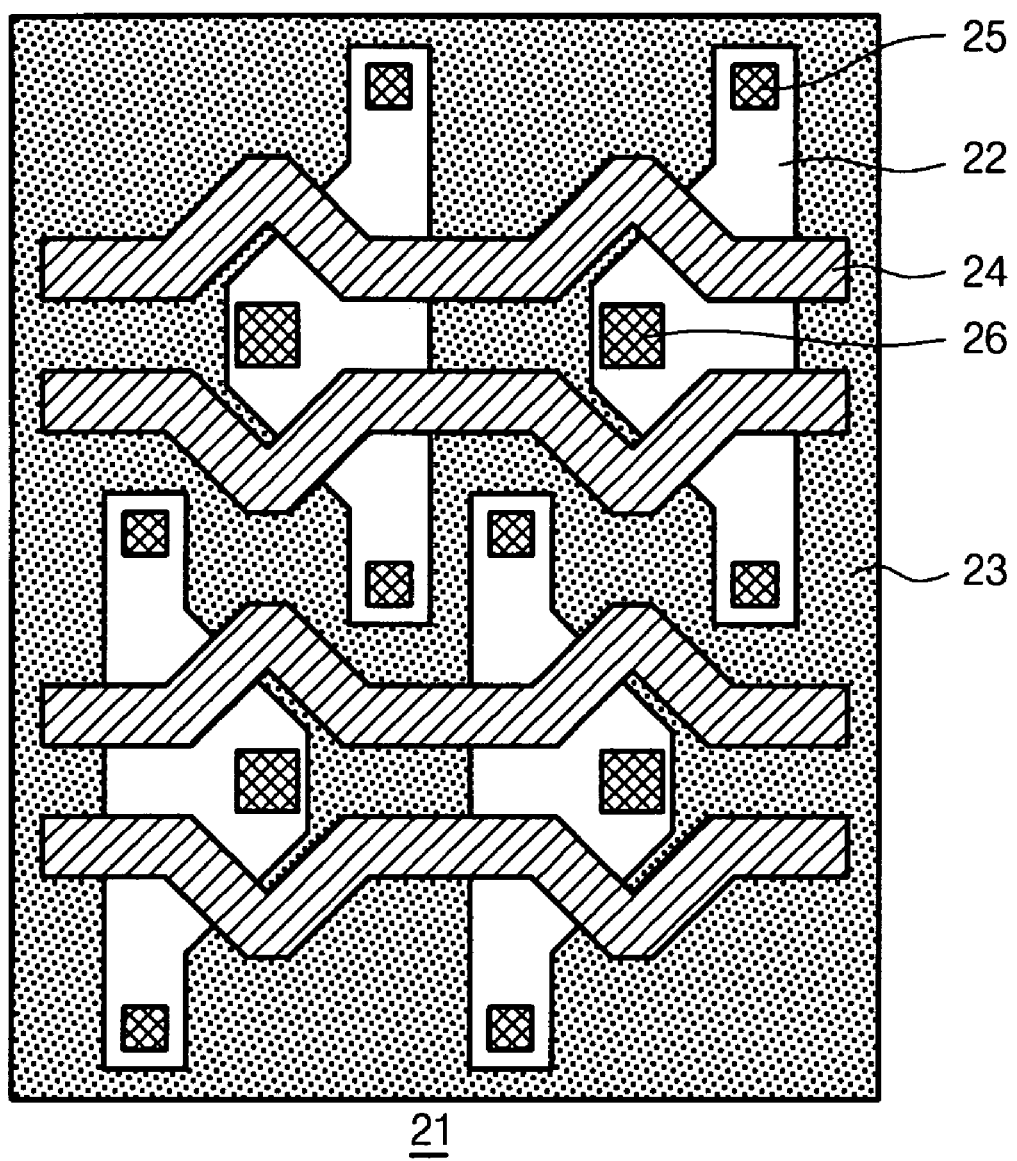

Referring to FIG. 2b, after forming an insulating interlayer (not shown) on the entire surface of the semiconductor substrate 21 such that the insulating interlayer covers the word line 24, the surface of the insulating interlayer is planarized. Then, after selectively etching predetermined portions of the insulating interlayer formed on a source area where a PCM cell is to be provided, and the drain area to which a supply voltage Vdd is to be applied, a first tungsten plug (not shown) is formed on the source area to be provided with the PCM cell, and a second tungsten plug (not shown) is formed on the drain area to which the supply voltage is to be applied by sequentially performing a tungsten deposition process and a chemical mechanical polishing (CMP) process.

Next, a metal layer is deposited on the insulating interlayer including the first tungsten plug and the second tungsten plug. A first metal pad 25 is formed on the first tungsten plug, and a second metal pad 26 is formed on the second tungsten plug by patterning the aforementioned metal layer. As can be seen in FIG. 2b, the second metal pad 26 formed on the upper part of the drain area to which the supply voltage is to be applied, is larger in cross section than the first metal pad 25 formed on the upper part of the source area to be provided with the PCM cell. The second metal pad 26 formed in the drain area, to which the supply voltage is to be applied has a larger cross section because it must be provided with a metal contact through subsequent processes, although the first metal pad 25 formed in the source area to be provided with the PCM cell is not necessary to be fabricated in a large size because a bottom electrode contact has a size identical to or less than 100 nm. Accordingly, the second metal pad 26 formed on the upper part of the drain area to which the supply voltage is to be applied must have a relatively greater size.

Figure 2C:
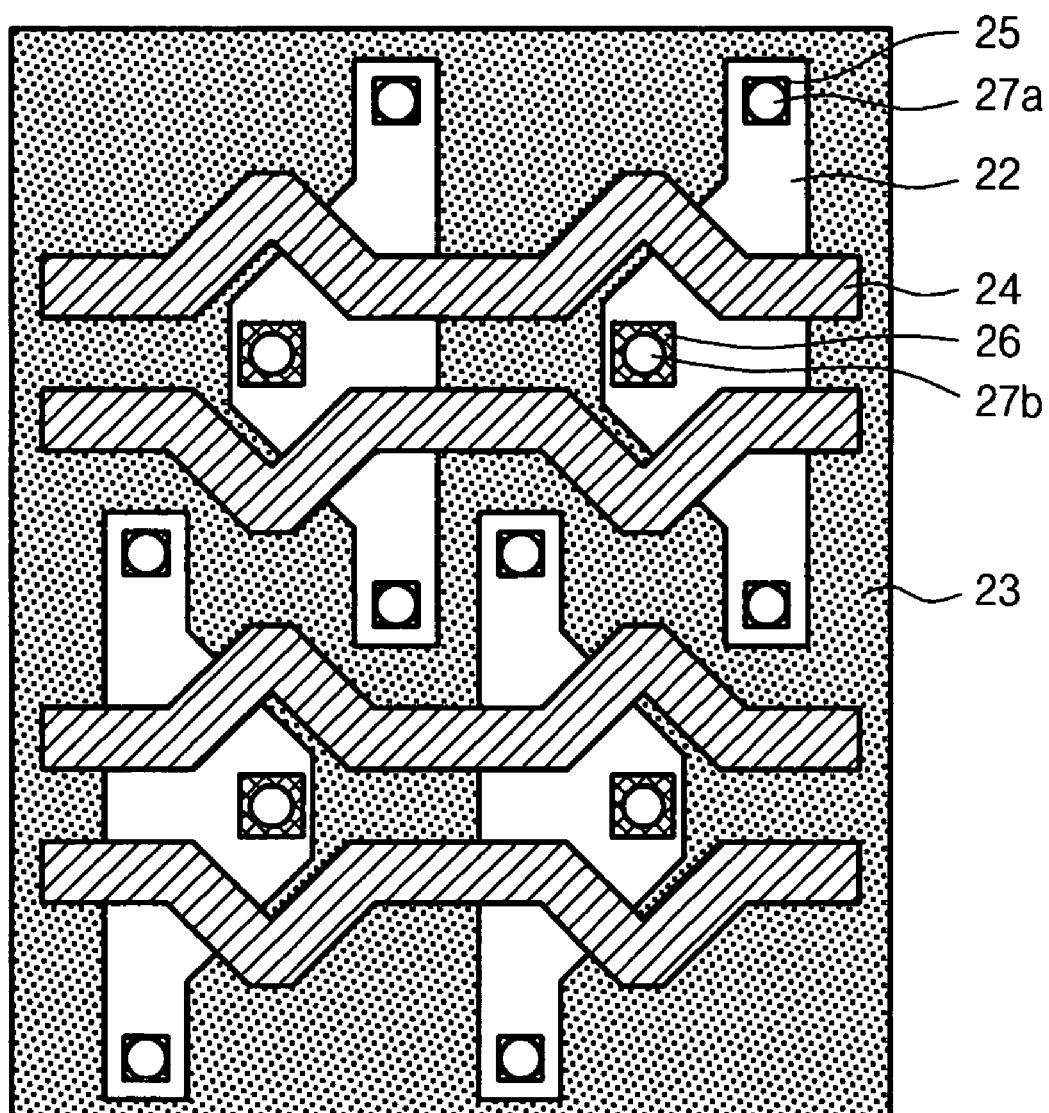

Referring to FIG. 2c, after the first oxide layer (not shown) has been deposited on the insulating interlayer including the first metal pad 25 and the second metal pad 26, the surface of the first oxide layer (not shown) is planarized.

Then, although it is not shown, a contact hole exposing the first metal pad 25 is formed by selectively etching a predetermined portion of the first oxide layer formed on the upper part of an area to be provided with a PCM cell, and then a plug-type bottom electrode, that is, a bottom electrode contact is formed by filling the contact hole with a conductive layer. After that, the PCM layer and the top electrode are sequentially formed on the bottom electrode contact, thereby forming the PCM cell having a stacked structure of the bottom electrode contact, the PCM layer and the top electrode.

After a second oxide layer (not shown) is deposited on the first oxide layer such that the second oxide layer can cover the PCM cell, the surface of the second oxide layer is planarized. Then, a first contact hole 27a exposing a top electrode of the PCM cell, and a second contact hole 27b exposing a second metal pad 26 of the area, to which a supply voltage is to be applied, are formed by selectively etching predetermined portions of the second oxide layer.

Figure 2D:
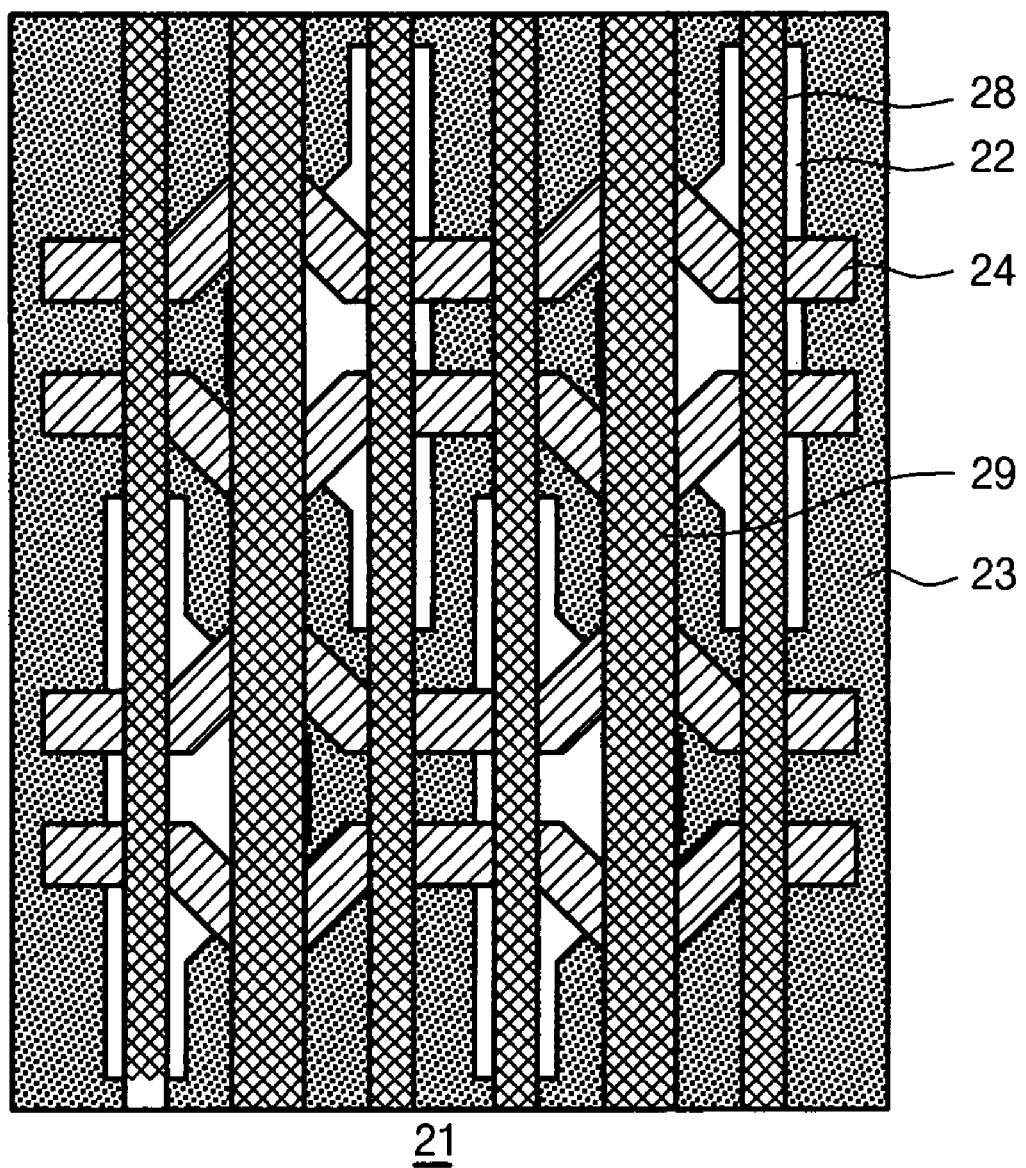

Referring to FIG. 2d, after depositing a metal layer on the second oxide layer such that the first and second contact holes are filled with the metal layer, the metal layer is patterned according to a typical process so as to form a first metal wiring 28 for a bit line used for signal sensing and making electrical contact with the top electrode of the PCM cell through the first contact hole and a second metal wiring 29 for applying a supply voltage to the drain area by making electrical contact with the second metal pad through the second contact hole. At this time, both the first metal wiring 28 for the bit line and the second metal wiring 29 for applying the supply voltage are formed in such a manner that the first metal wiring 28 and the second metal wiring 29 are arranged in a direction vertical to the word line 24. In particular, the first metal wiring 28 for the bit line is formed in such a manner that the first metal wiring 28 has a width wider than that of the second metal wiring 29 for applying a supply voltage.

Since the second metal wiring 29 for applying a supply voltage is formed such that the second metal wiring 29 can make contact with a drain area of the active area that is formed in a direction vertical to the word line 24, the second metal wiring 29 for applying the supply voltage may be formed in such a manner that the second metal wiring 29 has a width wider than that of the first metal wiring 28 for the bit line used for signal sensing.

As described above, a first metal wiring for a bit line used for signal sensing is formed on an upper part of a source. The second metal wiring for applying a supply voltage is formed on an upper part of a drain to which a supply voltage Vdd of a cell transistor is applied.

By forming the second metal wiring to have a width larger than that of the first metal wiring for a bit line used for signal sensing, it is possible to reduce or prevent voltage drop in a phase change RAM device. Accordingly, writing current necessary for changing the phase of a PCM layer may be made uniform in all cells, so that it is possible to improve characteristics of a phase change RAM device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A phase change RAM device comprising:

a semiconductor substrate;

an isolation layer formed on the semiconductor substrate so as to define a substantially trapezoidal shaped active area in the semiconductor substrate;

a word line formed over the active area of the semiconductor substrate including the isolation layer;

a source area and a drain area formed on respective sides of the word line in the active area;

a first metal pad formed in the source area, and a second metal pad formed in the drain area;

a PCM cell having a stacked structure of a bottom electrode, a phase change layer, and a top electrode formed on the first metal pad;

a first metal wiring for a bit line used for signal sensing, which is arranged in a direction vertical to the word line and which makes electrical contact with the top electrode of the PCM cell; and a second metal wiring for applying a supply voltage, which is arranged in a direction vertical to the word line and makes electrical contact with the second metal pad of the drain area.

2. The phase change RAM device as claimed in claim 1, wherein a length and a width of the word line determines a contact area between the active area and the word line.

3. The phase change RAM device as claimed in claim 1, further comprising:

an insulating interlayer interposed between the source/drain areas including the word line and first and second metal pads; and a first tungsten plug formed so as to connect the source area with the first metal pad in the insulating interlayer, and a second tungsten plug formed so as to connect the drain area with the second metal pad in the insulating interlayer.

4. The phase change RAM device as claimed in claim 1, wherein the second metal pad is larger than the first metal pad.

5. The phase change RAM device as claimed in claim 3, further comprising a first oxide layer formed on the insulating interlayer such that the first oxide layer covers the first and second metal pads.

6. The phase change RAM device as claimed in claim 5, wherein the bottom electrode is formed within the first oxide layer to have a plug shape.

7. The phase change RAM device as claimed in claim 5, further comprising a second oxide layer for covering the PCM cell formed on the first oxide layer.

8. The phase change RAM device as claimed in claim 1, wherein the second metal wiring for applying the supply voltage has a size larger than a size of the first metal wiring for the bit line so as to prevent voltage drop.

* * * * *